United States Patent [19]

Spigarelli et al.

[11] Patent Number: 4,832,250
[45] Date of Patent: May 23, 1989

[54] ELECTRONIC CIRCUIT BOARD REWORK AND REPAIR SYSTEM

[75] Inventors: Donald J. Spigarelli, Carlisle; William F. Drislane, Townsend, both of Mass.

[73] Assignee: Srtechnologies, Inc., Concord, Mass.

[21] Appl. No.: 54,959

[22] Filed: May 28, 1987

[51] Int. Cl.⁴ .............................................. B23K 1/00
[52] U.S. Cl. .................................... 228/102; 228/105; 228/7; 228/12; 228/269; 228/49.1; 228/19
[58] Field of Search .................... 228/7, 9, 12, 19, 20, 228/49.1, 105, 102, 264

[56] References Cited

U.S. PATENT DOCUMENTS

| | | | |
|---|---|---|---|
| 4,073,424 | 2/1978 | Kuilicke et al. | 228/7 |
| 4,116,376 | 9/1978 | Delorme et al. | 228/105 |
| 4,163,814 | 8/1978 | Nishioka | 228/9 |
| 4,426,571 | 1/1984 | Beck | 228/264 |
| 4,536,642 | 8/1985 | Homster | 219/374 |
| 4,610,388 | 9/1986 | Koltuniak et al. | 228/20 |
| 4,620,659 | 11/1986 | Holdway | 228/264 |
| 4,659,004 | 4/1987 | Fridman | 228/9 |
| 4,675,509 | 6/1987 | Hell | 219/528 |

Primary Examiner—Nicholas P. Godici
Assistant Examiner—Karen Skillman
Attorney, Agent, or Firm—Weingarten, Schurgin, Gagnebin & Hayes

[57] ABSTRACT

An electronic circuit board rework and repair system having a carriage manually movable to successive station positions and having a table thereon movable along mutually orthogonal axes for positioning of a circuit board clamped to the table. At a first station, a circuit board is loaded onto the table, and a microscope can be swung into position for inspection of the loaded board. At a second station, an intended component or circuit board site can be aligned by way of a visual image of the component and site, and the table locked in position. At a third station, the selected component or circuit board site is automatically in alignment with a programmable heater for selected heating of the component contacts and removal of the component by a pickup probe associated with the heater. The system is calibrated such that there is alignment between a visually established position at the second station and that component position under the heater at the third station. Components can also be attached to selected sites of a circuit board by operation of the system.

17 Claims, 7 Drawing Sheets

ELECTRONIC CIRCUIT BOARD REWORK AND REPAIR SYSTEM

FIELD OF THE INVENTION

This invention relates to electronic circuit board repaid apparatus and more particularly to apparatus for the rework and repair of printed circuit boards.

BACKGROUND OF THE INVENTION

Systems are generally known for the rework and repair of printed circuit boards. These systems include a table or carriage movable in X and Y directions, manually or by motor control. A circuit board is clamped to the table and is moved to a position below a heater for application of heat to an intended component of the circuit board for purposes of desoldering the component from the board. The heater is usually in the form of a small area nozzle which may include a vacuum pickup for removal of the component after melting of the solder by the heater nozzle. Other heaters employ a tip configuration to suit the intended pattern, such as a rectangular bar meeting the outline of the leads of an integrated circuit package. Other heaters use replacable heads of different configurations to accommodate intended heating patterns.

SUMMARY OF THE INVENTION

The present invention provides a semi-automated system for electronic circuit board rework and repair and which comprises a carriage for containing a circuit board and manually movable between successive stations of the system. The carriage includes a table positionable along mutually orthogonal axes for alignment of a circuit board site or component of the board. The carriage at a first station is in position for loading of a circuit board. The carriage after loading of the circuit board is moved to a second station at which is disposed a video camera for viewing selected components or circuit board sites for display on an associated video monitor screen. An intended component is aligned with the reticle of the video camera and the table is locked in position. The carriage is thereafter moved to a third station which includes a programmable heater and pickup probe. The system is calibrated such that alignment of a component at the second station via the video screen will achieve automatic alignment of that component at the third station. The component is selectively heated at the third station and the unsoldered component is removed from the board by the pickup probe.

The system also includes a component carrier attached to the movable carriage and which can be aligned with respect to the video camera for positioning of a component to be attached to the circuit board. The alignment of the component under the video camera at the second station will permit automatic alignment of that component under the pickup probe at the third station.

The system can be under the government of a microprocessor-based controller which has control routines stored therein and which can also store user-defined routines entered via a keyboard and controls of an associated front panel. The monitor screen displays video picture information from the camera for viewing and alignment of circuit board sites, and also displays text and graphic data from the microprocessor when in a data mode.

DESCRIPTION OF THE DRAWINGS

The invention will be more fully understood from the following detailed description taken in conjunction with the accompanying drawings in which:

FIG. 2 is a top view of the carriage of the system of

FIG. 3 is a sectional elevation view of the carriage of

DETAILED DESCRIPTION OF THE INVENTION

Figure 1:
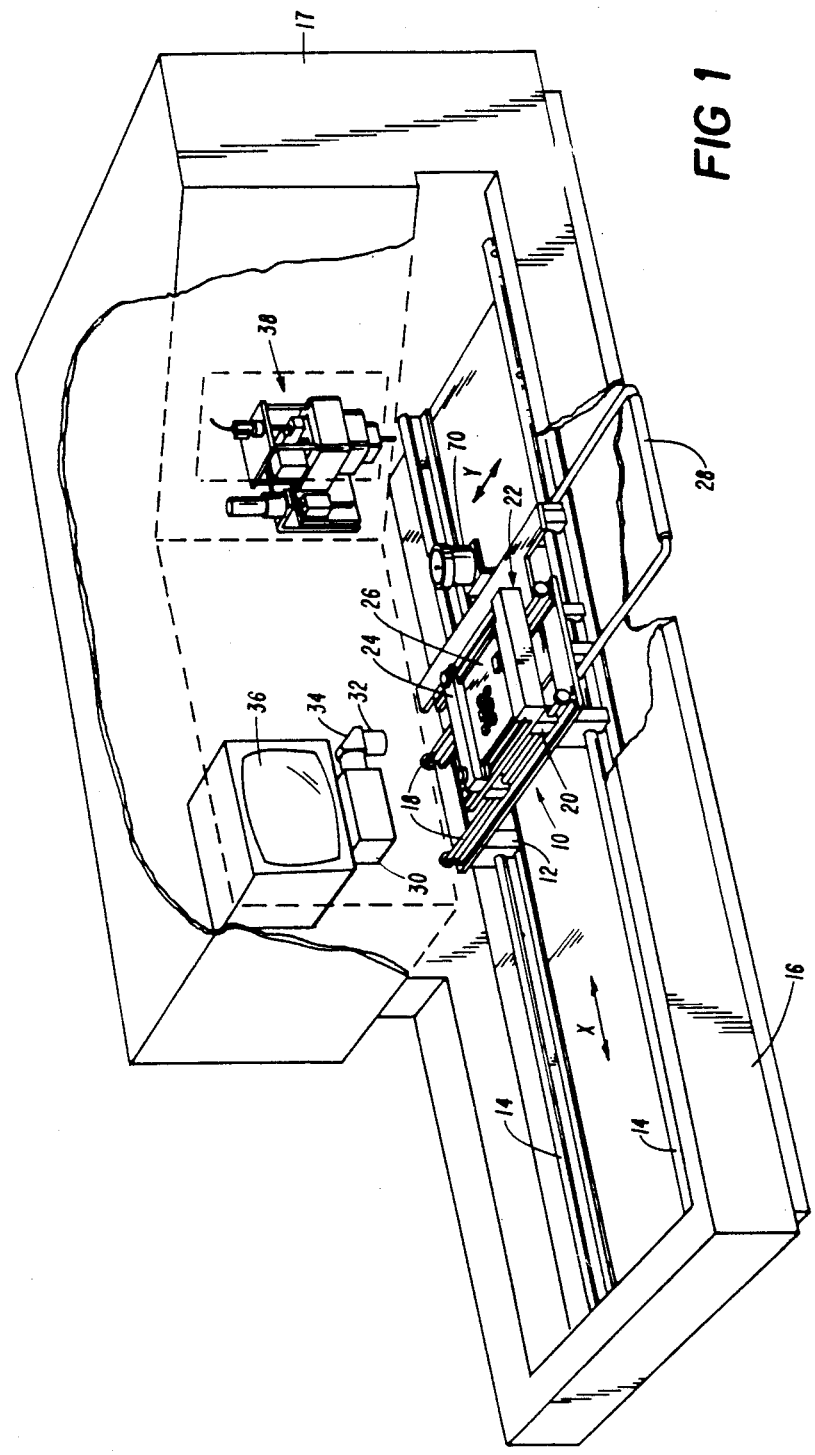
FIG. 1 is a cutaway pictorial view of a system in accordance with the invention.
Figure 2:
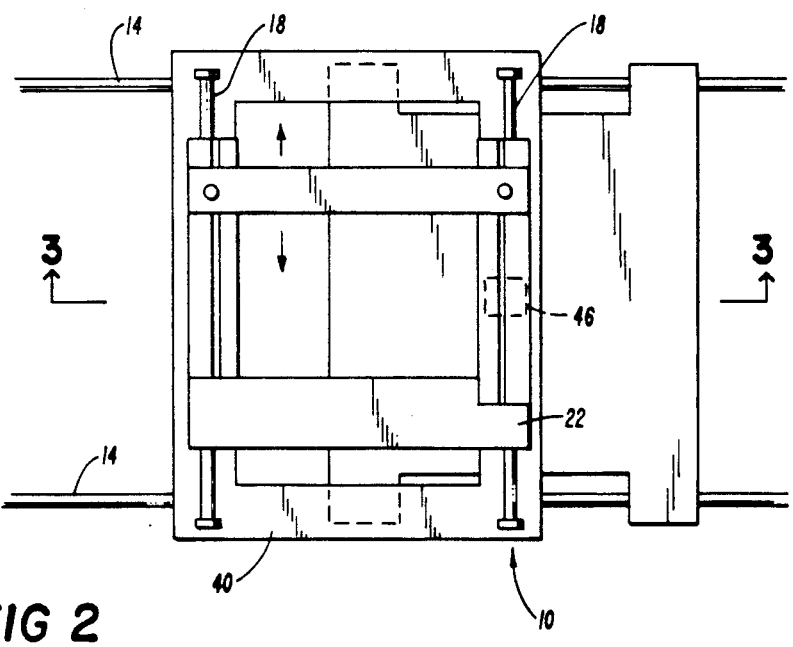
Figure 3:
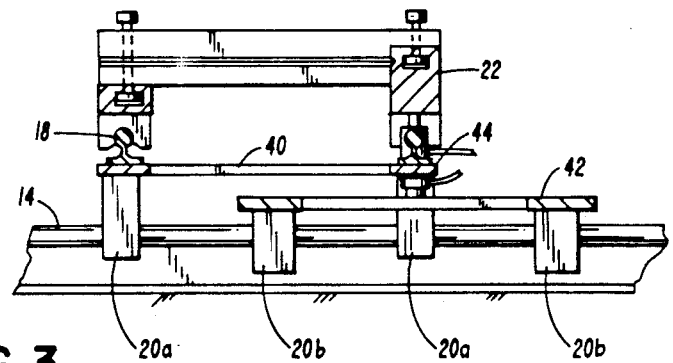

The system is shown in the drawing FIGS. 1-3 and includes a carriage 10 movable on guide rods 14 to successive work station positions. A video display screen 36 is provided on the housing 37, and within the housing is disposed a video camera 30 in position for viewing a circuit board 26 component disposed below the camera lens 32. The video camera is at the second work station position. A programmable heater 38 and pickup probe is disposed at the third work station position. The system is under the control of a microprocessor controller contained within the housing and coupled to operating controls and indicators contained on a front panel (FIG. 12) of the housing.

Referring to the drawing, FIGS. 1-3, a preferred embodiment is shown which includes a carriage 10 which is manually movable along an X direction by means of bearing blocks 12 which ride on a pair of spaced guide rods 14. The guide rods are supported within a housing 16. A pair of guide rods 18 is disposed along a Y direction orthogonal to the X direction on carriage 10 and on which is supported by bearing blocks 20 a table 22 which is movable along the guide rods 18 in the Y direction. The table 22 includes clamp means 24 operative to retain a circuit board 26. A handle 28 is operative to release a latch or detent mechanism for permitting movement of the carriage 10 along the X axis and to latch the carriage at a predetermined position at each station..

At the left most position of the housing 16 the table 22 is accessible for installation and removal of circuit boards to be operated upon. Second and third stations are provided within the enclosed upper portion 17 of the housing. At the second station there is a video camera 30 which in the illustrated embodiment is disposed in a horizontal position with the lens 32 vertically disposed and coupled to the camera by a right angle prism or mirror 34. A reticle is provided in association with the lens to provide a cross hair or other suitable reticle pattern on the monitor screen. A video monitor 36 is disposed in association with the camera and with the screen in a position to be viewed by an operator of the system. The camera is disposed for viewing of any component or component area disposed below the camera. A programmable heater 38 is provided at a third station within the housing, the heater being operative to provide heat in a selected pattern to the circuit board 26 lying below the heater for selective heating of the intended area of the circuit board for melting of solder and removal of the unsoldered component from the circuit board. The heater includes a vacuum pickup for lifting of the unsoldered component from the circuit board after the solder has been melted by the selectively applied heat.

The structure of the carriage is illustrated more particularly in FIGS. 2 and 3. The carriage 10 is composed of a first plate 40 which is supported on and movable along rods 14 by bearing blocks 20a. A plate 42 is supported and movable with respect to rods 14 by bearing blocks 20b, which straddle one side pair of bearing blocks 20a. The plate 42 can be clamped to plate 40 by means of a pneumatically actuated latch 44 such that plates 40 and 42 ride along rods 14 as a unit. When the clamp 44 is unlatched, the plate 40 is movable with respect to plate 42 to permit movement in the X direction of the table for alignment of an intended electronic component or site on circuit board 26 under the video camera lens 32. After an intended position has been achieved, the table 40 is again clamped to table 42 by clamp 44. The movement of table 22 in the Y direction is also selectively clamped by action of pneumatic clamp mechanism 46.

Figure 4:
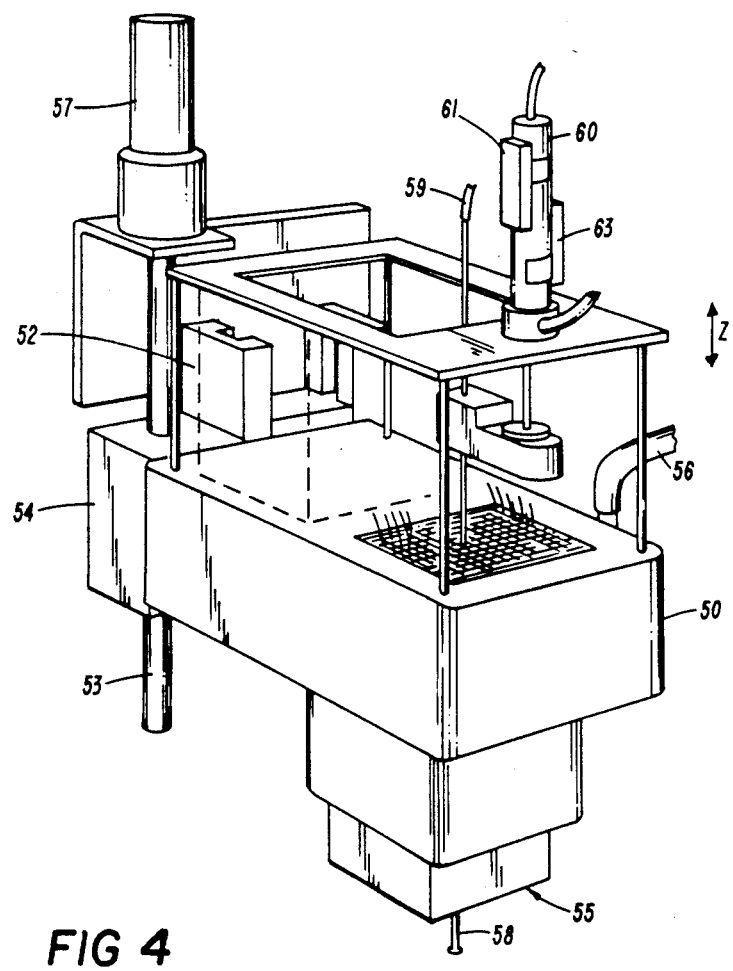
FIG. 4 is a pictorial view of the programmable heater of the system of FIG. 1.

The programmable matrix heater is shown in FIG. 4 and includes a housing 50 movable in the Z direction along a pair of guide rails 52 by a drive 54 such as a Roh-lix drive. The drive 54 is cooperative with shaft 53 which is rotatably driven by motor 57 to move housing 50 up or down in accordance with the direction of shaft rotation. The heater is composed of an array of openings in the bottom wall 55 in each of which is disposed an electrical resistance heater coil which can be selectively energized to provide configurable patterns of heat to suit specific circuit board requirements. Nitrogen or other suitable gas is introduced from a suitable source via tube 56 into the housing 50 and flows out of the array of openings at the bottom face of the heater. The gas is selectively heated by passage through the openings containing energized heater coils to provide an intended heat pattern for selective heating an unsoldering of electronic components on the circuit board. The heater coils can also be selectively energized to provide an intended magnitude of heat. The programmable heater itself is the subject of copending application Ser. No. 062,903 filed 6/16/87 of the same assignee as this invention.

A vacuum probe 58 is disposed centrally of the heater and is movable by a pneumatic actuator 60 between an extended position as shown in FIG. 4 and a retracted position in which the end of the pickup probe is substantially flush with the heater surface 55. The pickup probe is coupled to a suitable source of negative pressure by tube 59 to provide an intended suction force.

A pair of sensors 61 and 63 are attached to the casing of actuator 60 and are each operative to provide an electrical signal when the actuator piston within the casing is at respective positions of the sensors. The sensors are employed in providing two speed control of the movement of the heater. After a circuit board is disposed beneath the heater, the probe 58 is driven to its fully extended position and the housing 50 is driven by drive 54 downward toward the circuit board. This downward movement is at a first relatively faster speed which continues until the tip of probe 58 engages the underlying circuit board component or circuit board site at which point the probe is driven inward causing inward movement of the piston of actuator 60. When the piston reaches the position of sensor 63, that sensor provides an output signal to the controller of the drive motor 57 to cause motor operation at a second slower speed. The heater housing 50 continues its movement downward at this slower speed until the upwardly moving piston within actuator 60 triggers sensor 61, which provides an output signal to the motor controller to cause the motor to stop. The heater is thus driven to a position having a predetermined spacing from the underlying circuit board for efficient heating of the circuit board sites.

A heater 39 (FIG. 8) can be provided at the third station in a position below the circuit board to provide supplementary heating of the board. This heater is a non-programmed area heater and serves as a preheat or bias heat source for more rapid heating of the intended board areas.

Figure 5:
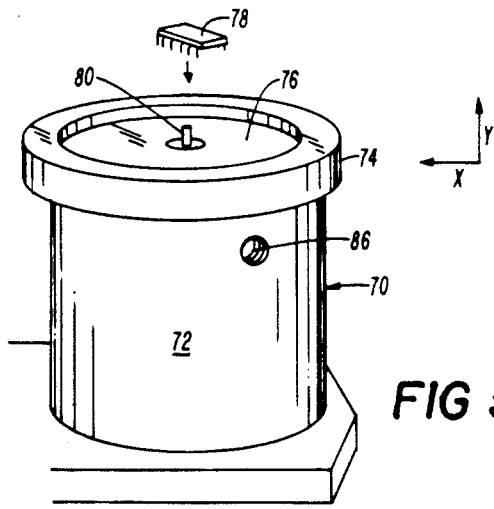
FIG. 5 is a pictorial view of the component carrier.
Figure 6:
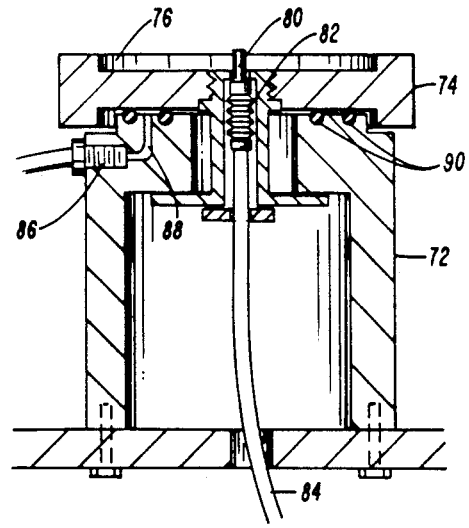
FIG. 6 is a sectional elevation view of the component carrier of FIG. 5.
Figure 7:
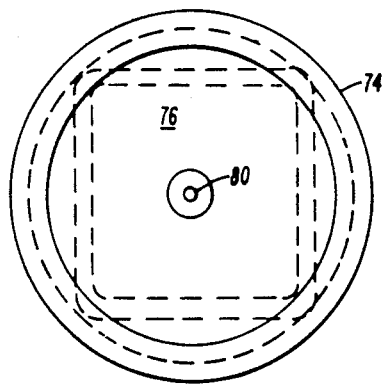
FIG. 7 is a top view of the component carrier of FIG. 5.

As seen more particularly in FIGS. 5-7, a component carrier 70 is attached to the plate 42 of carriage 10 and includes a cylindrical housing 72 having a cap 74 which is movable with respect to the housing within an X-Y plane and which has a recessed area 76 for acceptance of an electronic component 78. A vacuum probe 80, in the absence of a component, extends above the surface of the recessed area 76, this probe being connected via a bellows 82 to a vacuum line 84 connected to a suitable source of negative pressure. A vacuum line is also coupled via a fitting 86 to the housing 72 in which is provided a passage 88 which terminates at an upper face of the housing between a pair of O-ring seals 90 to confront the cap 74. When an electronic component 78 is placed in contact with the activated vacuum probe 80, the vacuum pressure will cause the bellows 82 to contract to thereby pull the component down onto the surface of the recessed area 76 of the cap. The cap with the component retained thereon by vacuum can be manipulated by manual movement of the cap to an intended position. After the user has aligned the cap and the component thereon, vacuum is applied to fitting 86 by suitable control activation, thereby to lock the cap 74 in position with respect to the housing 72. By this procedure, the component can be accurately located and aligned with respect to a reticle of the video camera, as seen on the video monitor.

Figure 8:
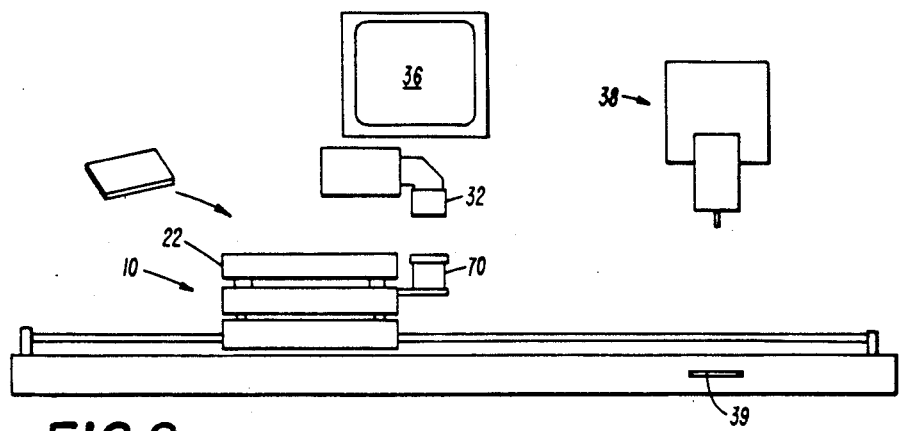
FIG. 8 is a diagrammatic elevation view of the system with the carriage at the first station.
Figure 9:
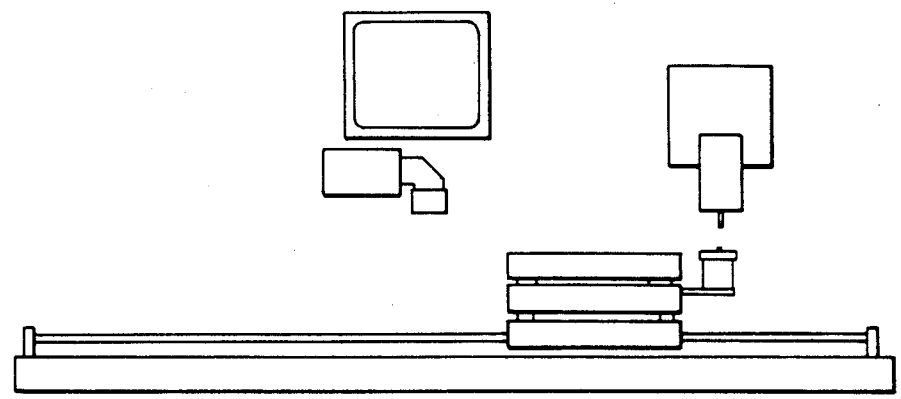
FIG. 9 is a diagrammatic elevation view of the system with the carriage at the second station.
Figure 10:
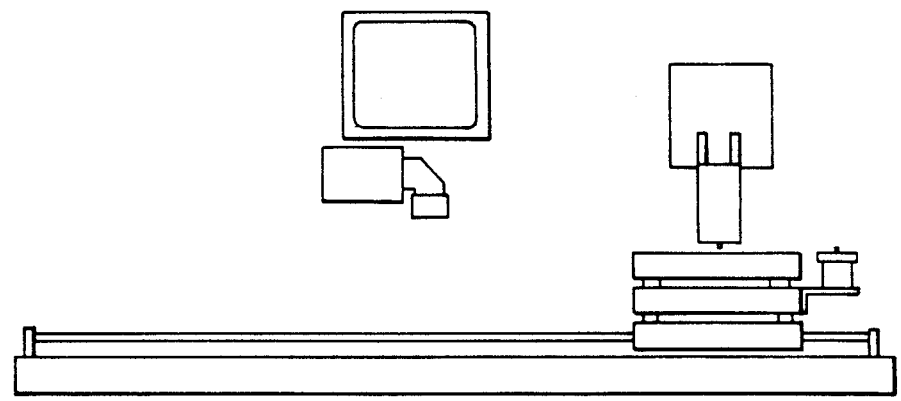
FIG. 10 is a diagrammatic elevation view of the system with the carriage at the third station.

The operation of the system is described in conjunction with FIGS. 8-10. At the first work station position, shown in FIG. 8, a circuit board can be installed on the table or removed therefrom. With the carriage in the first position, the carrier 70 is aligned beneath lens 32 to permit alignment of a component on the carriage with the aid of the visual image on screen 36. At the first carriage position, visual inspection of a circuit board and its components can also be made, since the board is accessible to viewing either directly by an observer or with the aid of a microscope or other viewing or inspection instrument.

At the second work station position, illustrated in FIG. 9, the table 22 is disposed beneath the video camera lens 32 and the table and the circuit board carried thereon can be manually adjusted in X and Y directions for locating an electronic component or site on the circuit board or an electronic component on the component carrier to be centered on the cross hairs of the video lens, as viewed on the display screen. At this second position, the carrier 70 is aligned under the heater 38.

At the third work station, illustrated in FIG. 10, the component or circuit board site which was aligned with the cross hairs at the second station is automatically centered in alignment with the programmable heater and pickup probe at the third station position 3.

The system is initially calibrated to provide a predetermined distance between the cross hair position at the second station and the heater center position at the third station. Once calibrated, the location of a site on the circuit board, or the component carrier, determined at the second station will be retained when the board is moved to the third station, so that this same site is now aligned with the heater and pickup probe for removal of a component on the board or for installation of a component onto that site of the board.

If a component is to be installed on a circuit board, that component is placed on the component carrier 70 and aligned with the cross hairs visible on the monitor with the component holder disposed below the video camera lens.

As discussed, the system is calibrated such that alignment of a component at the second station will automatically align that component beneath the heater of the third station. Similarly, alignment of a component on the component carrier at the second station will automatically align that component with respect to the pickup probe of the heater head at the third station so that the component will be held in position for installation onto a predetermined site of the circuit board.

For installation of a component onto a circuit board, the component is first aligned on the component carrier 70 with the cross hairs visible on the video monitor. The carrier is moved to the third station where the component is picked up by the probe of the heater head. The table is returned to the second station, and the circuit board is aligned to an intended site with respect to the cross hairs, and the table is then moved back to the third station where the component is installed onto the aligned site of the circuit board for reattachment of the component to the board.

Figure 11:
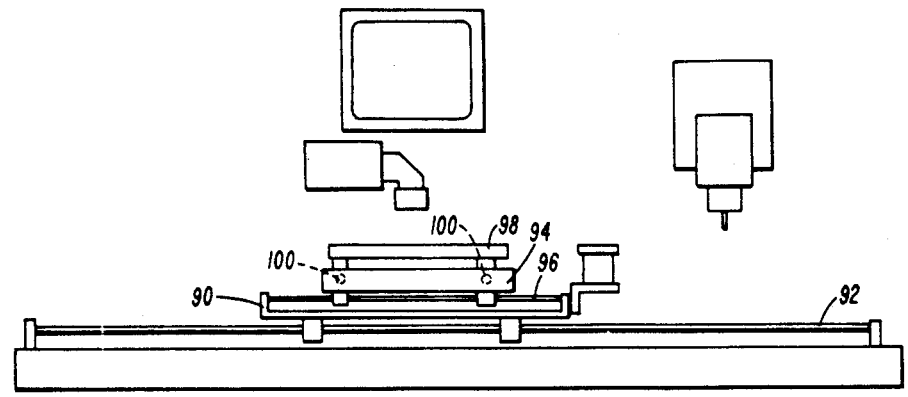
FIG. 11 is a diagrammatic elevation view of an alternative embodiment of the system.

Another embodiment is shown in FIG. 11 in which the carriage 90 is movable along an X direction on guide rods 92, and a table 94 is movable for fine positioning in the X direction on separate guide rods which are supported on the carriage 90. Movement in the Y direction is provided by a table 98 movable along guide rods 100 supported on the table 94. This embodiment operates in the same fashion as described above.

Figure 12:
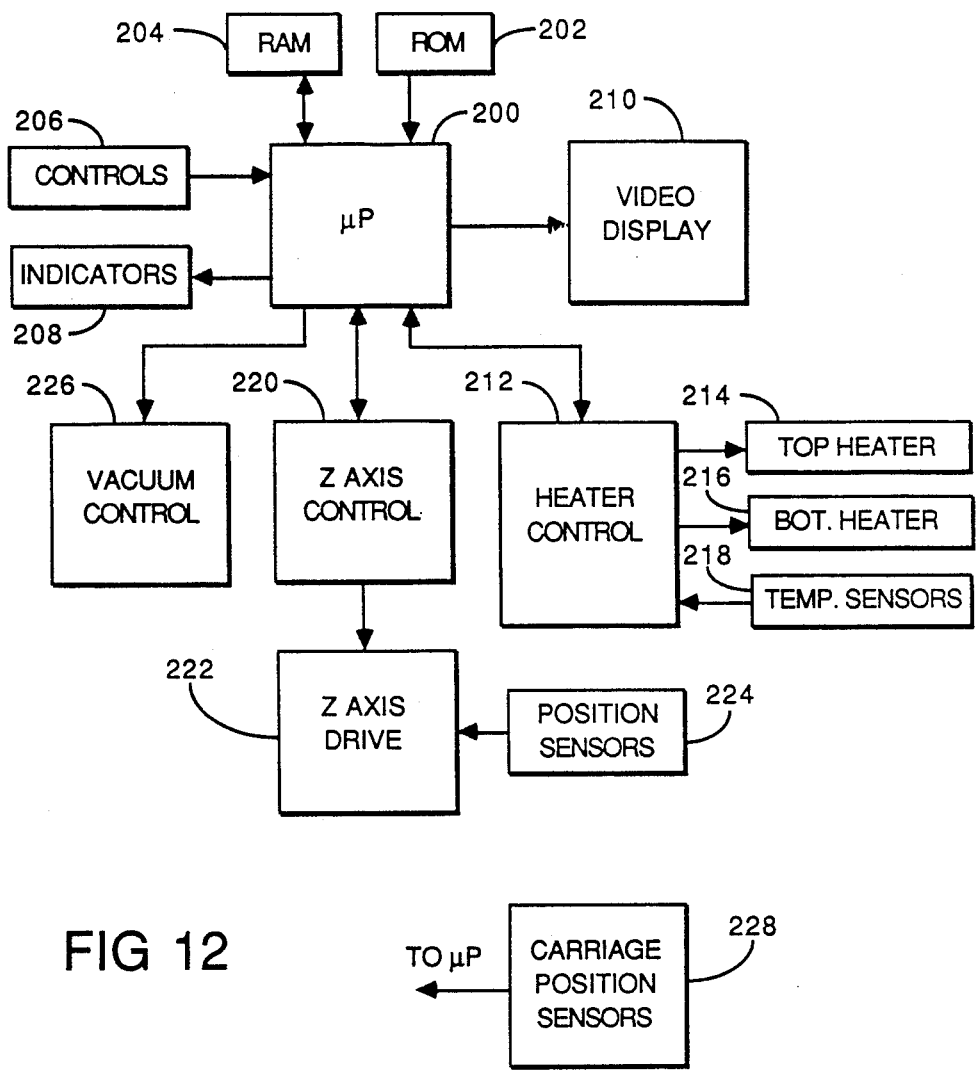
FIG. 12 is a block diagram of the control apparatus of the system.

The control apparatus for the system is shown in block diagram form in FIG. 12. The system includes an operating panel which contains the controls and indicators for operation of the system. A microprocessor 200 includes a read-only memory (ROM) 202 and a random access memory (RAM) 204 which respectively contain the operating system software for the microprocessor and the changeable data which is entered during use of the system. Commands are provided to the microprocessor 200 by controls 206, and indicators 208 provide output representations in response to appropriate commands from the microprocessor. The microprocessor also provides signals for driving the video display 210 when the display is used for depicting text and graphical data, when not in the video mode coupled to camera 30. A heater control 212 is cooperative with microprocessor 200 and provides energizing signals to a top heater 214 which preferably is the programmable heater described above, and a bottom heater 216 which typically is a non-programmable heater for providing supplementary heating of the circuit board. Temperature sensors 218 provide signals to the heater control 212 representative of measured temperature at the circuit board surface or at the heater faces. A Z axis control 220 is also cooperative with the microprocessor and provides control signals to a Z axis drive 222 which provides movement of the programmable heater toward and away from the circuit board surface. Position sensors 224 provide position information to the control 220 for closed loop control of the heater position above the board surface. The microprocessor also provides signals to a vacuum control 226 which governs the application of vacuum to the pickup probe, to the component carrier and to the pneumatic latches for the table. Carriage position sensors 228 provide position signals to the microprocessor for denoting carriage position at the respective stations.

The system is operative to control the process variables which typically include time, temperature, gas flow, vertical position of the heater head above the component, pick and place, and heating pattern. In addition, the system is capable of storing one or more operational sequences or cycles for rework and/or repair of particular circuit boards and components. Different heating patterns and cycles, as well as different parameter values for the controllable parameters are readily stored and accessible for selection to accommodate particular operational requirements.

The invention is not to be limited by what has been particularly shown and described except as indicated in the appended claims.

What is claimed is:

1. Apparatus for disconnecting a surface mounted electrical component from an electronic circuit board to permit the rework/repair of the circuit board and for thereafter reconnecting a surface mounted electrical component to the circuit board comprising:
   a carriage movable to successive stations along a first axis;
   a component carrier attached to and movable with said carriage comprising;
      a movable component receiving surface;
      a cap peripherally mounted on said component receiving surface;
      a vacuum probe extending from said component receiving surface to engage an electrical component positioned on said component receiving surface; and
      vacuum means interfacing with said cap to selectively lock said cap against movement after manual adjustment of the cap and electrical component to a predetermined alignment position;
   a table supported on the carriage for movement along mutually orthogonal axes;
   means on the table for retaining an electronic circuit board thereon and normally operative at a first station for loading and unloading a board from the table;
   a viewing instrument disposed at a second station and operative to align the electrical component surface mounted on the circuit board disposed at the second station, said table being locked to retain the intended aligned position;

means for aligning the carrier with respect to the viewing instrument of the second station when the carriage is at the first station, the carrier also being aligned with the heater when the carriage is at the second station; and selectively energizeable heater means at a third station in calibrated position with respect to the viewing instrument of the second station such that, upon alignment of the surface mounted electrical component with the viewing instrument at the second station, the surface mounted electrical component will be automatically aligned with the selectively energizeable heater when the table and the circuit board carried thereon is moved to the third station.

2. The apparatus of claim 1 wherein the carriage includes:

manually operative means for moving the carriage to each of the plurality of the stations and for clamping the carriage and table at selective positions.

3. The apparatus of claim 1 wherein the viewing instrument includes:

a video camera disposed in position at the second station to view the alignment site, and a video display coupled to the video camera.

4. The apparatus of claim 3 wherein the video camera includes reticle means in operative association therewith for display of an alignment reticle on the video display screen.

5. The apparatus of claim 3 further including control means operative to control the viewing instrument and heater.

6. The apparatus of claim 5 wherein the video display is operative to provide video display of an image derived from the video camera in a first mode, and text and graphic information display from signals derived from the control means in a second mode.

7. Apparatus for disconnecting a surface mounted electrical component from an electronic circuit board to permit the rework/repair of the circuit board and for thereafter reconnecting a surface mounted electrical component to the circuit board comprising:

a carriage moveable to successive stations along a first axis;

a table supported on the carriage for movement along mutually orthogonal axes;

means on the table for retaining an electronic circuit board thereon and normally operative at a first station for loading and unloading a board from the table;

a viewing instrument disposed at a second station and operative to align the electrical component surface mounted on the circuit board disposed at the second station said table being locked to retain the intended aligned position, comprising;

a video camera disposed in position at the second station to view the alignment site and a video display coupled to the video camera;

selectively energizeable heater means at a third station in calibrated position with respect to the viewing instrument of the second station such that, upon alignment of the surface mounted electrical component with the viewing instrument at the second station, the surface mounted electrical component will be automatically aligned with the selectively energizeable heater when the table and the circuit board carried thereon is moved to the third station, the heater means comprising a programmable heater having a plurality of heater elements selectively energizeable to provide a predetermined heat profile for selective heating of a surface mounted electronic component and immediately adjacent area of the circuit board; and control means operative to control the viewing instrument and heater.

8. The apparatus of claim 7 wherein the heater means includes a vacuum probe disposed centrally of the heater and means for moving the probe between an extended position to engage an electrical component and a retracted position.

9. The apparatus of claim 8 wherein the heater means includes:

means for driving the heater structure at a first speed downward toward an underlying circuit board until a predetermined distance above the circuit board is reached, upon which the driving means drives the heater structure downward at a lower speed than the first speed until a second predetermined position above the circuit board is reached.

10. The apparatus of claim 8 wherein the heater means comprises:

drive means for driving the housing toward and away from an underlying circuit board;

means coupling said vacuum probe to a source of negative pressure;

sensor means operative to provide electrical signals when the housing is at predetermined positions in relation to an underlying circuit board;

the drive means being operative to drive the housing at a first speed toward the circuit board and in response to a signal from the sensor means to drive the housing at a slower speed toward the circuit board.

11. The apparatus of claim 1 wherein the heater means includes:

a vacuum probe disposed centrally of the heater;

a pneumatic actuator coupled to the probe and operative to move the probe to an extended position to engage an electrical component on the electronic circuit board and a retracted position;

means coupling the probe to a source of negative pressure;

drive means for driving the heater to a position having a predetermined spacing from the underlying circuit board;

first and second sensors attached to the actuator and each operative to provide an electrical signal when the actuator is in respective positions;

the drive means being operative to drive the housing downward toward the circuit board at a first speed and to drive the housing toward the circuit board at a slower speed in response to a signal from the first sensor and, in response to a signal from the second sensor, to discontinue driving of the housing.

12. The apparatus of claim 11 wherein:

the drive means is operative to drive the housing at a first speed toward the circuit board with the probe in an extended position;

the probe tip upon engagement with an underlying component, being driven inward to cause corresponding movement of the actuator and the provision of a signal from the first sensor when the actuator reaches a predetermined position;

the drive means being operative in response to the first sensor signal to drive the housing at a slower speed toward the circuit board until the movement of the probe and actuator causes triggering of the second sensor which provides a second sensor signal to stop the drive means.

13. Apparatus for disengaging a surface mounted electrical component from an electronic circuit board comprising:
a carriage movable between a plurality of stations;
means for moving the carriage to predetermined positions at each of the stations;
a component carrier attached to and movable with said carriage, comprising:
a cylindrical housing having a cap movable with respect thereto within a horizontal plane;
a vacuum probe centrally disposed and normally upstanding from the upper surface of the cap;
means coupling the vacuum probe to a source of negative pressure;
a vacuum orifice in the housing confronting the cap;
means coupling the vacuum orifice to a source of negative pressure;
the vacuum probe being operative upon engagement with a component placed thereon to pull the component onto the top surface of the cap; and
means operative to apply negative pressure to the vacuum orifice to lock the cap in position after manual adjustment of the cap to a predetermined alignment position;
a table mounted on the carriage and movable along first and second mutually orthogonal axes;
means for clamping the table at selected positions along said axes;
means for retaining the circuit board on the table;
means at one station for viewing at least one surface mounted electrical component and the area of the circuit board supporting the component located at the station on the table and for displaying on a video screen the viewed area and a superimposed reticle;
heater means for selectively applying heat in predetermined profile to the circuit board and surface mounted component to melt the solder connecting the surface mounted component to the circuit board at a station adjacent to the one station and spaced from the one station by a predetermined distance such that the area of the circuit board aligned with the reticle at the one station will be automatically aligned under the heater when the carriage is moved to the adjacent station; and
vacuum means depending from said heater means for engaging the surface mounted component after the solder connecting the surface mounted component to the circuit board is melted.

14. The apparatus of claim 10 wherein said control means operative to control the viewing instrument and heater comprises:
microprocessing means having a read-only memory containing the operating system software and a random access memory containing changeable data;
control means connected to the microprocessing means to provide commands thereto;
indicator means connected to the microprocessing means to provide output representations in response to selected signals therefrom;
video display means connected to and driven by the microprocessing means; and
heater control means connected to the microprocessing means for providing energizing signals to the programmable heater.

15. The apparatus of claim 14 wherein said control means operative to control the viewing instrument and heater further comprises:
temperature sensing means cooperative with said heater control means for providing signals to said heater control means representative of measured temperature at the third station;
vertical control means cooperative with the microprocessing means for providing control signals to said housing drive means;
housing position sensing means cooperative with said vertical control means for providing signals thereto representative of the position of said heater housing; and
carriage position sensing means cooperative with the microprocessing means for providing position signals to the microprocessing means representative of the position of the carriage at the second and third stations.

16. The apparatus of claim 15 further comprising vacuum control means connected to the microprocessing means for providing control signals to said heater vacuum probe said component carrier vacuum probe and said vacuum orifice.

17. The apparatus of claim 7 wherein the carriage includes manually operative means for moving the carriage to each of the plurality of stations and for clamping the carriage and table at selective positions.

* * * * *

UNITED STATES PATENT AND TRADEMARK OFFICE
CERTIFICATE OF CORRECTION

PATENT NO. : 4,832,250
DATED : May 23, 1989
INVENTOR(S) : Donald J. Spigarelli et al.

It is certified that error appears in the above-identified patent and that said Letters Patent is hereby corrected as shown below:

Column 1, lines 6-7, "re- paid" should read --re- pair--.

Column 2, line 8, "system of " should read --system of FIG. 1;--.

Column 2, line 9, "carriage of" should read --carriage of FIG. 2;--.

Column 4, line 41, "80,. the" should read --80, the--.

Column 8, line 64, "tip upon" should read --tip, upon--.

Signed and Sealed this

Thirtieth Day of July, 1991

Attest:

HARRY F. MANBECK, JR.

*Attesting Officer*  Commissioner of Patents and Trademarks